United States Patent [19]
Iida et al.

[11] 4,308,089
[45] Dec. 29, 1981

[54] METHOD FOR PREVENTING CORROSION OF AL AND AL ALLOYS

[75] Inventors: Shinya Iida, Tama; Kazuyoshi Ueki, Ohme; Tatsumi Mizutani, Kokubunji; Hideo Komatsu, Hinodemachi; Kado Hirobe, Koganei, all of Japan

[73] Assignee: Hitachi, Ltd., Tokyo, Japan

[21] Appl. No.: 148,283

[22] Filed: May 9, 1980

[30] Foreign Application Priority Data

May 28, 1979 [JP] Japan ................................ 54-65030

[51] Int. Cl.$^3$ ..................... C23F 1/02; C23C 15/00; C23G 1/02; B08B 30/00
[52] U.S. Cl. ..................................... 156/643; 134/3; 134/28; 134/29; 134/30; 156/646; 156/659.1; 156/665; 204/192 EC; 204/192 E; 252/79.1
[58] Field of Search ............ 156/643, 646, 656, 659.1, 156/665, 638; 204/164, 192 EC, 192 E, 298; 252/79.1; 427/39; 134/1, 26, 3, 28, 30, 34, 41

[56] References Cited
U.S. PATENT DOCUMENTS
4,148,705  4/1979  Battey .............................. 204/192 E OTHER PUBLICATIONS
Kodak Microelectronics Seminar Proceedings Interface, 1977, Plasma Etching of Aluminum by Herndon et al., pp. 33-41.

Primary Examiner—William A. Powell
Attorney, Agent, or Firm—Craig and Antonelli

[57] ABSTRACT

Disclosed is a method for preventing corrosion of Al and Al alloys processed by the dry-etching method, which comprises (i) the step of sputtering Al or Al alloy in an ammonia-containing atmosphere and (ii) the step of washing the sputtered Al or Al alloy with an alkaline aqueous solution and then with water after termination of the step (i).

According to this method, corrosion of Al or Al alloy by halogen element-containing substances stuck to Al or Al alloy during the dry-etching treatment can be effectively prevented.

14 Claims, No Drawings

METHOD FOR PREVENTING CORROSION OF AL AND AL ALLOYS

BACKGROUND OF THE INVENTION

1. Field of the Invention

The present invention relates to a method for preventing corrosion of Al and Al alloys. More particularly, the present invention relates to a method for preventing corrosion of Al and Al alloys to which halogen element-containing substances adhere. Furthermore, the present invention relates to a method for preventing corrosion of Al and Al alloys which have been pocessed by the dry-etching method.

2. Brief Description of the Prior Art

Al, Al-Si alloys and Al-Cu-Si alloys are used as materials of electrodes and wires of semiconductor devices and surface acoustic wave devices. These methods are recently practiced by the dry-etching technique for formation of patterns of electrodes or wires.

A halogen element-containing gas is used as a reactive gas as an atmosphere for dry-etching of Al or Al alloy. As a chlorine-containing gas used as the reactive gas, there are used HCl, $BCl_3$, $CCl_4$, $PCl_3$, $SiCl_4$, $CCl_3F$, $C_2HCl_3$ and mixtures of two or more of these gases, and as a bromine-containing gas, there are used $CHBr_3$, $BBr_3$, $PBr_3$, $SiBr_4$ and mixtures of two or more of these gases. Furthermore, a mixture of a chlorine-containing gas and a bromine-containing gas and a mixture of a halogen-containing gas and other gas may be used.

A reactive gas such as mentioned above is introduced into an etching chamber, and micro-wave or high frequency field is applied to the reactive gas to cause glow discharge and by utilizing generated ions or radicals, Al or Al alloy having a mask of a photoresist or electron resist on the surface thereof is etched to effect fine processing.

When the processed sample is taken out into the open air after completion of the etching treatment, since the components of the reactive gas used for the etching operation adhere to the sample and they react with water contained in air, corrosion of Al or Al alloy is advanced. This phenomenon takes place in case of pure aluminum, but the phenomenon is conspicuous in case of Al alloy, especially Cu-containing Al alloy. Ordinarily, the Cu content in Cu-containing Al alloy used for semiconductor devices is 0.5 to 4% by weight. The higher is the Cu content, the more vigorous is corrosion by adhesion of the halogen components. Ordinarily, as the contents of impurities contained in Al alloy are increased, the degree of corrosion is increased.

From results of experiments made by us, it was confirmed that in case of Al alloys where the above-mentioned corrosion is vigorous, corrosion takes place within several minutes when the sample is taken out into the open air. Accordingly, even if a corrosion-preventing treatment is carried out after the lapse of this period, no substantial effect can be attained. Thus, it was confirmed that in order to prevent the above-mentioned corrosion in Al and Al alloys, it is necessary to carry out a corrosion-preventing treatment in a bell jar used for etching just after completion of the etching operation.

The above-mentioned corrosion of Al or Al alloy by adhesion of halogen components is caused not only in the process for manufacture of semiconductor devices but also in other fields.

The following references are cited to show the state of the art:
(i) U.S. Pat. No. 3,951,709, and
(ii) U.S. Pat. No. 4,030,967.

Furthermore, Japanese Patent Application Laid-Open Specification No. 158343/79 (the patent application is now pending) can be cited as a prior application, though this is not a known prior art reference.

SUMMARY OF THE INVENTION

It is therefore a primary object of the present invention to provide a method for preventing Al or Al alloy to which halogen components adhere, especially Al or Al alloy which has been processed by the dry-etching method, in which the defects and disadvantages involved in the above-mentioned conventional techniques can be eliminated.

In accordance with the present invention, the above-mentioned object can be attained by a method for preventing corrosion of Al and Al alloys, which comprises (i) the step of sputtering Al or Al alloy in an atmosphere containing ammonia ($NH_3$) and (ii) the step of washing the sputtered Al or Al alloy with a liquid after completion of the step (i). If the step of sputtering Al or Al alloy in an atmosphere containing $CF_4$ is inserted before the step (i), especially good results are obtained. Furthermore, if a gas formed by incorporating $CF_4$ into ammonia gas is used at the step (i), results as good as the results obtained by insertion of the above additional step can be obtained by the sputtering step (i) alone.

The ammonia content in the ammonia-containing atmosphere is at least 10% by volume, preferably at least 50% by volume. As the ammonia concentration is high, the time of exposure of Al or Al alloy to plasma is shortened and the damage given to the sample or contamination of the sample is reduced, and better results are obtained. If the ammonia content is lower than 10% by volume, the damage or contamination is increased and no good results are obtained.

As the gas to be incorporated in ammonia, there can be mentioned inert gases such as Ar, He and $N_2$ and Freon gases such as $CF_4$. These gases may be used singly or in the form of a mixture of two or more of them. In short, any of gases other than those having bad influences on Al and Al alloys, such as water and halogens, may be used. Especially good results are obtained when Freon gases such as $CF_4$ and other F-containing compounds are used.

In the present invention, Al or Al alloy is sputtered in an atmosphere containing ammonia. The sputtering time during which the sample is exposed to plasma is preferably 0.5 to 5 minutes. If this time is shorter than 0.5 minute, the intended object of attaining a high corrosion-preventing effect cannot be sufficiently attained. If this time is longer than 5 minutes, the sample is excessively damaged or contaminated. A most preferred sputtering time is about 2 minutes.

It is preferred that the gas pressure of the ammonia-containing atmosphere be 0.01 to 3 Torr, especially 0.01 to 0.5 Torr, particularly especially 0.3 to 0.5 Torr. If the gas pressure is too low, the sample is excessively damaged or contaminated, and if the gas pressure is too high, generation of plasma becomes difficult and no good results are obtained. A higher gas pressure, however, is preferred so far as plasma can be conveniently generated.

In order to generate plasma at the sputtering step, a micro-wave or high frequency field is applied to the above-mentioned atmosphere. In this case, the power density is adjusted to less than 0.3 W/cm$^2$. If the power density exceeds this level, a sample of Al or Al alloy is excessively damaged or contaminated and no good results are obtained. However, if the power density is too low, plasma is not generated and sputtering becomes impossible. Accordingly, the power density is adjusted to a level exceeding the critical value for generating plasma. A most preferred power density is in the range of from 0.2 to 0.25 W/cm$^2$.

As the sputtering apparatus, there is ordinarily used a diode type sputtering machine, but the applicable apparatus is not limited to this machine. Any of apparatuses capable of generating plasma can be used. When the dry-etched sample is subjected to the corrosion-preventing treatment, it is preferred that sputtering be carried out in an ammonia-containing atmosphere in the sputtering apparatus used at the dry-etching step. The dry-etched Al or Al alloy should be subjected to the corrosion-preventing treatment just after completion of the etching operation. Accordingly, the sample is kept in the bell jar used for etching or is introduced into a different chamber maintained under a reduced pressure, and sputtering is carried out in an ammonia-containing atmosphere.

The Al or Al alloy sample which has thus been sputtered in the ammonia-containing atmosphere is not corroded at all even if it is taken out into air. The reason is that the halogen element adhering to the surface of the sample, for example, Cl, is stabilized and neutralized to NH$_4$Cl. However, if the sample is placed in a high-humidity atmosphere or dipped in water, stabilized NH$_4$Cl is dissociated and Cl ions are formed again, causing corrosion of Al or Al alloy.

In order to prevent corrosion by dissociation of stabilized NH$_4$Cl or the like, the sample should be washed with running deionized water, or should be dipped in an alkaline aqueous solution for 0.5 to 2 minutes and washed with running deionized water. By this washing treatment, NH$_4$Cl or the like is removed and corrosion of Al or Al alloy will not be caused any more. If washing with running water is carried out at room temperature for at least 5 minutes, NH$_4$Cl or the like is sufficiently removed. However, in case of a sample having many convexities and concavities on the surfaces thereof, sufficient removal of adsorbed NH$_4$Cl or Al is impossible. In this case, if this running water washing is carried out after the sample has been dipped in an alkaline aqueous solution for more than 5 minutes, corrosion can be completely prevented. An alkaline aqueous solution containing Na or K has bad influences on a semiconductor device including, for example, Si elements. Accordingly, an aqueous solution of ammonia, hydrazine hydrate or ethylene diamine is preferably used as the alkaline aqueous solution. If such bad influences are not imposed, other alkaline aqueous solutions may be used. It is preferred that the concentration of the aqueous solution of ammonia or hydrazine hydrate be high and at least 20% by volume. If the concentration is lower than this level, there is a fear of corrosion by water used for dilution. The dipping treatment in the alkaline aqueous solution is advantageous in that a high corrosion-preventing effect can be obtained even in case of Al alloy which has a relatively high Cu content and is readily corroded. When an aqueous solution of hydrazine hydrate is used as the alkaline aqueous solution, since hydrazine hydrate hardly reacts with Al, even if the sample is dipped in this solution for a sufficiently long time, Al is not damaged at all and the dipping treatment may be conducted for more than 2 minutes.

If the above-mentioned liquid washing is carried out after sputtering in an ammonia-containing atmosphere, corrosion of Al or Al alloy can be prevented. If the step of sputtering in a CF$_4$-containing atmosphere is inserted before the step of sputtering in an ammonia-containing atmosphere, the corrosion-preventing effect is further enhanced, and this effect is especially conspicuous in case of Al or Al alloy which has been dry-etched in a gas containing BCl$_3$ or CCl$_4$.

The CF$_4$ content in the sputtering atmosphere is at least 10% by volume, preferably at least 50% by volume. As the gas to be incorporated into CF$_4$, there are preferably used inert gases such as Ar, He and N$_2$ and Freon gases other than CF$_4$. Any of gases other than those having bad influences on Al or Al alloy samples, such as water and halogens, may be used. The reason for limitation of the gas composition in the sputtering atmosphere is the same as described above with respect to the ammonia-containing atmosphere.

The time of sputtering in the CF$_4$-containing atmosphere is 0.5 to 2 minutes, preferably 0.5 to 1 minute. If this sputtering time is longer than 2 minutes, the sample is excessively damaged or contaminated, and especially in case of a semiconductor device, Si or SiO$_2$ of the substrate below Al lines is etched and no good results are obtained. If the sputtering time is shorter than 0.5 minute, no substantial effect is attained by insertion of this sputtering step.

The gas pressure of the CF$_4$-containing atmosphere is 0.01 to 1 Torr, preferably 0.01 to 0.5 Torr. The reason for limitation of the gas pressure is the same as described above with respect to the ammonia-containing atmosphere.

The power density of a micro-wave or high frequency field applied to the CF$_4$-containing atmosphere is lower than 0.4 W/cm$^2$ but is above the critical value capable of plasma discharge. If the power density exceeds 0.4 W/cm$^2$, the sample is seriously damaged and no good results are obtained. A lower power density is preferred so far as discharge is possible. An apparatus as described above with respect to sputtering in the ammonia-containing atmosphere can similarly be used.

When the surface of the Al or Al alloy sample treated according to the corrosion-preventing method of the present invention is analyzed by XPS (X-ray photoelectron spectroscopy), none of corroding components such as Cl are detected.

Good corrosion-preventing effects can be obtained when the corrosion-preventing method of the present invention is applied to Al and ordinary Al alloys. More specifically, good results are obtained when Al alloys used as wiring materials of semiconductor devices, such as an Al-Si alloy containing 1 to 4% by weight of Si, and Al-Cu alloy containing 0.5 to 4% by weight of Cu and an Al-Cu-Si alloy containing 0.5 to 4% by weight of Cu are treated according to the method of the present invention. Especially high corrosion-preventing effects can be obtained when Al and Al alloys which have been processed by the dry-etching method are treated according to the corrosion-preventing method of the present invention. This dry-etching method is one that is well-known in the field of manufacture of semiconductor devices, and the outline of this method is as described hereinbefore. All of Al and Al alloys processed according to this dry-etching method can be effectively treated according to the corrosion-preventing method of the present invention.

DETAILED DESCRIPTION OF THE PRESENTLY PREFERRED EMBODIMENTS

EXAMPLE 1

According to the sputtering method, a film of an Al-Cu-Si alloy containing 4% by weight of Cu and 2% by weight of Si was formed in a thickness of 2 $\mu$m on an Si substrate having a thermal oxide film having a thickness of 0.6 $\mu$m, and a mask of a photoresist (AZ 1350 manufactured by Shipley Co., USA) having a thickness of 1 $\mu$m was formed on the aluminum alloy film to form a predetermined pattern. The so formed sample was placed in an etching chamber of a diode type sputtering machine and $BCl_3$ gas was introduced at a flow rate of 50 ml/min to keep a gas pressure of 0.180 Torr. A high frequency (13.56 MHz) field was applied to cause discharge and effect etching. The termination of etching was confirmed by an etching monitor using Al spectrum at 396 nm as the monitor signal, and overetching was conducted for 5 minutes. After removal of $BCl_3$, $CF_4$ gas was introduced into the etching chamber at a flow rate of 10 cc/min to keep a gas pressure of 0.15 Torr and sputtering was carried out with a high frequency power of 200 W (power density=0.2 W/cm$^2$). After removal of $CF_4$, $NH_3$ gas was introduced at a flow rate of 30 cc/min and sputtering was carried out with a high frequency power of 200 W under a gas pressure of 0.3 Torr for 1.5 minutes. Then, dry $N_2$ was introduced into the bell jar to restore the atmospheric pressure, and the sample was taken out into air. In order to remove Cu residue, the sample was dipped in a solution of $HNO_3$ for 1 minute, and was subsequently washed with aqueous ammonia for 2 minutes and with water for 5 minutes and was dried. When the sample was observed, it was found that Al lines having a width of 2 to 3 $\mu$m were not corroded at all, and even if the Al wires were subjected to subsequent processings, they were not changed at all.

EXAMPLE 2

A film of an Al-Si alloy containing 2% by weight of Si was formed in a thickness of 2 $\mu$m by vacuum deposition on an Si wafer having a diameter of 76 mm and including a thermal oxide film having a thickness of 0.6 $\mu$m. In the same manner as described in Example 1, a fine pattern mask of a photoresist was formed on the Al-Si alloy film and the sample was placed in an etching chamber of a diode type etching machine. A mixed gas of $CCl_4$ and He (mixing ratio=1/10) was introduced into the etching chamber at a flow rate of 150 ml/min to keep a gas pressure of 0.18 Torr. A high frequency power of 13.56 MHz was applied at a power density of 0.3 W/cm$^2$ to cause discharge and effect etching. When the etching operation was conducted for 15 minutes, the termination of etching was confirmed, and introduction of the mixed gas of $CCl_4$ and He was stopped and supply of the high frequency power was cut off. $NH_3$ gas was introduced at a flow rate of 50 ml/min instead to keep a gas pressure of 0.3 Torr and a high frequency power was applied at a power density of 0.2 W/cm$^2$. Then, the sample was taken out into air, and it was then washed with running deionized water for 5 minutes. It was found that no corrosion took place in the wire pattern obtained according to this process, and it was confirmed that a sufficient corrosion-preventing effect could be attained by this process.

EXAMPLE 3

The same starting sample as described in Example 1 was placed in a bell jar of a diode type sputtering machine, and $BCl_3$ containing 10% by volume of $CF_4$ was introduced into the bell jar and the sample was sputtered and etched at a high frequency power density of 0.25 W/cm$^2$ for about 20 minutes to obtain a fine pattern composed of an Al-Cu-Si alloy. Introduction of the $BCl_3$ gas was stopped and a 1:1 mixed gas of $NH_3$ and $CF_4$ was introduced into the bell jar at a flow rate of 50 ml/min to keep a gas pressure of 0.10 Torr, and sputter cleaning was carried out at a high frequency power density of 0.15 W/cm$^2$ for 1.5 minutes. The sample was taken out into air, and it was dipped in a solution containing nitric acid to remove Cu residue. Then, the sample was washed with running water at room temperature for 5 minutes. When the surface of the sample was analyzed by XSP, components participating in corrosion, such as B and Cl, were not detected at all.

EXAMPLE 4

A film of an Al-Cu-Si alloy containing 1% by weight of Cu and 2% by weight of Si was formed in a thickness of 0.6 $\mu$m by sputtering vacuum deposition on a PSG film (phospho-silicate glass film), and a predetermined mask pattern was formed on the alloy film by using an electron beam resist. A plurality of the so formed samples were placed in an etching chamber and a mixed gas of $BCl_3$ and $CCl_4$ (each being fed at a flow rate of 100 ml/min) was introduced to keep a gas pressure of 0.20 Torr. A high frequency power was supplied at a power density of 0.3 W/cm$^2$ to cause discharge and effect etching of the Al alloy. Etching was completed within about 4.5 minutes and a wiring of the Al alloy was formed. Then, supply of the mixed gas of $BCl_3$ and $CCl_4$ was cut off and the discharge was stopped. Thus, the bell jar was evacuated and the pressure was reduced. Then, $NH_3$ gas was introduced into the bell jar at a flow rate of 30 ml/min and also He gas was introduced at a flow rate of 30 ml/min to adjust the gas pressure to 0.5 Torr. A high frequency power was applied at a power density of 0.3 W/cm$^2$ for 1.5 minutes to effect plasma cleaning. The sample was taken out into air, dipped in an aqueous solution containing 30% by volume of ammonia for 1 minute and washed with running water for 5 minutes. The so obtained sample was subjected to an accelerated degradation test where the sample was allowed to stand in an atmosphere maintained at a relative humidity of 80% and a temperature of 80° C. for 10 hours. No corrosion was caused to occur in the aluminum alloy wiring.

Obviously many modifications and variations of the present invention are possible in the light of the above teachings. It is therefore to be understood that within the scope of the appended claims the invention may be practised otherwise than as specifically described.

What is claimed is:

1. A method for preventing corrosion of Al and Al alloys, which comprises (i) the step of sputtering Al or Al alloy in an atmosphere containing ammonia and (ii) the step of washing the Al or Al alloy with a liquid after termination of the step (i).

2. A method for preventing corrosion of Al and Al alloys according to claim 1 wherein the step of sputtering Al and Al alloy in an atmosphere containing CF$_4$ is carried out prior to said step (i).

3. A method for preventing corrosion of Al and Al alloys according to claim 1 or 2 wherein the Al or Al alloy is one that has been processed according to the dry-etching method.

4. A method for preventing corrosion of Al and Al alloys according to claim 3 wherein the dry-etching method comprises discharging a halogen element-containing gas and processing the Al or Al alloy with formed ions or radicals.

5. A method for preventing corrosion of Al and Al alloys according to claim 4 wherein the halogen element-containing gas is a gas containing at least one member selected from the group consisting of HCl, BCl$_3$, CCl$_4$, PCl$_3$, SiCl$_4$, CCl$_3$F, C$_2$HCl$_3$, CHBr$_3$, BBr$_3$, PBr$_3$ and SiBr$_4$.

6. A method for preventing corrosion of Al and Al alloys according to claim 1 or 2 wherein the ammonia content in the ammonia-containing atmosphere is at least 10% by volume.

7. A method for preventing corrosion of Al and Al alloys according to claim 6 wherein the ammonia content is at least 50% by volume.

8. A method for preventing corrosion of Al and Al alloys according to claim 6 wherein the liquid used at the liquid washing step is water.

9. A method for preventing corrosion of Al and Al alloys according to claim 6 wherein the liquid washing comprises washing with an aqueous solution of ammonia or hydrazine hydrate and subsequent washing with water.

10. A method for preventing corrosion of Al and Al alloys according to claim 2 wherein the CF$_4$ content in the CF$_4$-containing atmosphere is at least 10% by volume.

11. A method for preventing corrosion of Al and Al alloys according to claim 10 wherein the CF$_4$ content is at least 50% by volume.

12. A method for preventing corrosion of Al and Al alloys according to claim 6 wherein the ammonia-containing atmosphere contains an inert gas or CF$_4$.

13. A method for preventing corrosion of Al and Al alloys according to claim 12 wherein the ammonia-containing atmosphere contains CF$_4$.

14. A method for preventing corrosion of Al and Al alloys according to claim 12 wherein the ammonia-containing atmosphere contains an inert gas.

* * * * *